US 6,767,835 B1

(12) United States Patent
Nariman et al.

(10) Patent No.: US 6,767,835 B1
(45) Date of Patent: Jul. 27, 2004

(54) METHOD OF MAKING A SHAPED GATE ELECTRODE STRUCTURE, AND DEVICE COMPRISING SAME

(75) Inventors: Homi E. Nariman, Austin, TX (US); David E. Brown, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 168 days.

(21) Appl. No.: 10/135,616

(22) Filed: Apr. 30, 2002

(51) Int. Cl.[7] ............................................. H01L 21/302

(52) U.S. Cl. ....................... 438/710; 438/713; 438/718; 438/719; 438/721; 438/741

(58) Field of Search ................................ 438/710, 713, 438/718, 719, 721, 741

(56) References Cited

U.S. PATENT DOCUMENTS

| | | | |
|---|---|---|---|
| 4,897,368 A | 1/1990 | Kobushi et al. ............. | 437/200 |
| 5,034,348 A | 7/1991 | Hartswick et al. .......... | 437/200 |
| 5,447,875 A | 9/1995 | Moslehi ....................... | 437/41 |
| 5,851,890 A | 12/1998 | Tsai et al. .................... | 438/303 |
| 5,937,319 A | 8/1999 | Xiang et al. ................. | 438/585 |
| 5,998,273 A | 12/1999 | Ma et al. ...................... | 438/305 |
| 6,017,809 A | 1/2000 | Inumiya et al. .............. | 438/585 |
| 6,046,105 A | 4/2000 | Kittl ............................ | 438/655 |
| 6,069,032 A | 5/2000 | Lee .............................. | 438/197 |
| 6,074,938 A | 6/2000 | Asamura ...................... | 438/533 |
| 6,093,609 A | 7/2000 | Chuang ........................ | 438/286 |

(List continued on next page.)

FOREIGN PATENT DOCUMENTS

EP 0 123 456 A2 10/1984 ............ H04N/7/12

OTHER PUBLICATIONS

Goto et al., "Optimization of Salicide Processes for sub 0.1–μm CMOS Devices," *1994 Symposium on VLSI Technology Digest of Technical Papers*, pp. 119–120, Apr. 1994.
Sohn et al., "High Thermal Stability and Low Junction Leakage Current of Ti Capped Co Salicide and its Feasibility for High Thermal Budget CMOS Devices," Mar. 1998.
Goto et al., "A New Leakage Mechanism of Co Salicide and Optimized Process Conditions," *IEEE Transactions on Electron Devices*, vol. 46, No. 1, p. 117, Jan. 1999.

*Primary Examiner*—Nadine G. Norton
*Assistant Examiner*—Binh X. Tran
(74) *Attorney, Agent, or Firm*—Williams, Morgan & Amerson, P.C.

(57) ABSTRACT

In one illustrative embodiment, the method comprises forming a gate insulation layer above a substrate, forming a layer of polysilicon above the gate insulation layer, implanting a dopant material into the layer of polysilicon, forming an undoped layer of polysilicon above the doped layer of polysilicon and performing an etching process on the undoped layer of polysilicon and the doped layer of polysilicon to define a gate electrode having a width at an upper surface that is greater than a width of the gate electrode at a base of the gate electrode. In further embodiments, the method comprises forming a layer of refractory metal above the gate electrode and performing at least one heating process to form a metal silicide region on the gate electrode structure. In another illustrative embodiment, the method comprises forming a gate insulation layer above a substrate, forming a first layer of polysilicon above the gate insulation layer, implanting a dopant material into the first layer of polysilicon to form a doped region having a dopant concentration level in the layer of polysilicon, forming a second layer of polysilicon above the doped region of the first layer of polysilicon, the second layer of polysilicon having a dopant concentration level that is less than the dopant concentration level of the doped region in the first layer of polysilircon, and performing an etching process on the second layer of polysilicon and the doped region in the first layer of polysilicon to define a gate electrode having a width at an upper surface that is greater than a width of the gate electrode at a base of the gate electrode.

54 Claims, 6 Drawing Sheets

U.S. PATENT DOCUMENTS

| | | | | |
|---|---|---|---|---|
| 6,114,228 A | * | 9/2000 | Gardner et al. | 438/585 |
| 6,121,138 A | | 9/2000 | Wieczorek et al. | 438/682 |
| 6,127,267 A | | 10/2000 | Matsubara et al. | 438/656 |
| 6,140,192 A | | 10/2000 | Huang et al. | 438/305 |
| 6,156,615 A | | 12/2000 | Kepler | 438/305 |
| 6,174,762 B1 | | 1/2001 | Bronner et al. | 438/230 |
| 6,482,688 B2 | * | 11/2002 | Hu et al. | 438/182 |
| 6,596,599 B1 | * | 7/2003 | Guo | 438/305 |

* cited by examiner

METHOD OF MAKING A SHAPED GATE ELECTRODE STRUCTURE, AND DEVICE COMPRISING SAME

BACKGROUND OF THE INVENTION

1. Field of the Invention

This invention relates generally to semiconductor fabrication technology, and, more particularly, to a method of making a shaped gate electrode structure, and a device comprising same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

FIG. 1 depicts an example of an illustrative transistor 10 fabricated on a wafer or substrateI 11. The transistor 10 is comprised of a gate insulation layer 14, a gate electrode 16, sidewall spacers 19, a drain region 18A, and an source region 18B. Trench isolation regions 17 are formed in the substrate 11. Also depicted in FIG. 1 are a plurality of conductive contacts 15 formed in a layer of insulating material 21. The conductive contacts 15 provide electrical connection to the drain and source regions 18A, 18B. As constructed, the transistor 10 defines a channel region 12 in the substrate 11 beneath the gate insulating layer 14. The substrate 11 is normally doped with an appropriate dopant material, i.e., a P-type dopant such as boron or boron difluoride for NMOS devices, or an N-type dopant such as arsenic or phosphorous for PMOS devices.

As the critical dimension of transistors have continued to decrease, the distance between the drain and source regions 18A, 18B may not, in some cases, be the limiting factor in terms of the device performance. Typically, the gate electrode 16 depicted in FIG. 1 has a longitudinal dimension, i.e., a dimension into the page, that extends up to approximately 20 $\mu$m whereas the critical dimension 16A of the gate electrode 16 may be as small as 70–180 nm, and further reductions are planned in the future. In general, the gate electrode 16 is used to establish a transverse electric field to activate the transistor 10. Since the gate electrode 16 is typically contacted at only one end, the electrical charges used to establish the electrical field have to be transported along the entire longitudinal length of the gate electrode 16 to uniformly build up the transverse electrical field. Given the small critical dimension 16A of the gate electrode 16, which is usually comprised of polycrystalline silicon, the electrical resistance of the gate electrode 16 is relatively high which tends to result in relatively high RC-delay time constants. As a result, the development of the transverse electrical field necessary to fuilly open the channel region 12 is delayed, thereby deteriorating the switching speed of the transistor 10. As a consequence, the rise and fall times of the electrical signals are increased and the operating frequency, i.e., the clock frequency, is decreased. Thus, the operating speed or switching time of field effect transistors may no longer be limited by the length of the channel region 12, but may depend, at least to some degree, upon the delay in signal propagation along the longitudinal length of the gate electrode 16.

Additionally, the drive to reduce the critical dimension 16A of the gate electrode 16 to smaller sizes is limited, at least to some degree, by the ability of photolithography tools to accurately pattern the feature, i.e., the gate electrode 16, to the desired size or critical dimension 16A. Although efforts are continually being made to improve the ability of photolithography tools, techniques and systems to reduce the critical dimensions of features formed on an integrated circuit device, such efforts may not be successful for a number of years, if at all. Thus, a need exists for forming features, such as the gate electrode 16 depicted in FIG. 1, with a critical dimension 16A that may be less than a size which may be directly formed using existing photolithography tools, methods and systems.

The present invention is directed to various methods and a device that may solve, or at least reduce, some or all of the aforementioned problems.

SUMMARY OF THE INVENTION

The present invention is generally directed to a method of making a shaped gate electrode structure, and a device comprising same. In one illustrative embodiment, the method comprises forming a gate insulation layer above a substrate, forming a layer of polysilicon above the gate insulation layer, implanting a dopant material into the layer of polysilicon, forming an undoped layer of polysilicon above the doped layer of polysilicon and performing an etching process on the undoped layer of polysilicon and the doped layer of polysilicon to define a gate electrode having a width at an upper surface that is greater than a width of the gate electrode at a base of the gate electrode. In further embodiments, the method comprises forming a layer of refractory metal above the gate electrode and performing at least one heating process to form a metal silicide region on the gate electrode structure.

In another illustrative embodiment, the method comprises forming a gate insulation layer above a substrate, forming a first layer of polysilicon above the gate insulation layer, implanting a dopant material into the first layer of polysilicon to form a doped region having a dopant concentration level in the layer of polysilicon, forming a second layer of polysilicon above the doped region of the first layer of polysilicon, the second layer of polysilicon having a dopant concentration level that is less than the dopant concentration level of the doped region in the first layer of polysilicon, and performing an etching process on the second layer of polysilicon and the doped region in the first layer of polysilicon to define a gate electrode having a width at an upper surface that is greater than a width of the gate electrode at a base of the gate electrode.

BRIEF DESCRIPTION OF THE DRAWINGS

The invention may be understood by reference to the following description taken in conjunction with the accompanying drawings, in which like reference numerals identify like elements, and in which.

Figure 1:
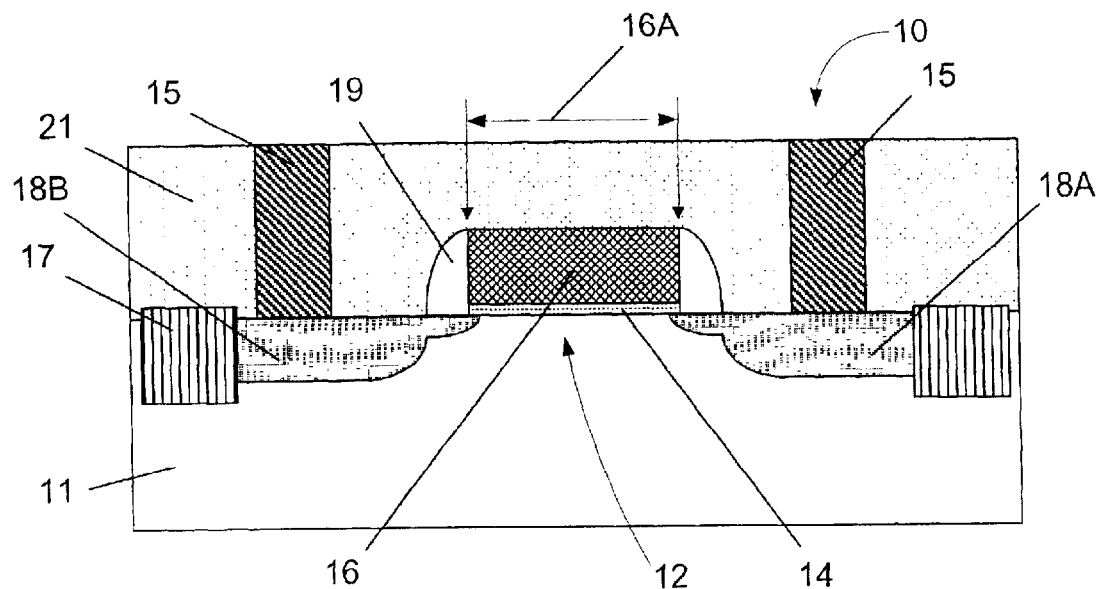
FIG. 1 is a cross-sectional view of an illustrative prior art semiconductor device formed above a substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of making a shaped gate electrode structure, and a device comprising same. Although the present invention will be initially disclosed in the context of the formation of an illustrative NMOS transistor, those skilled in the art will understand after a complete reading of the present application that the present invention is not so limited. More particularly, the present invention may be employed with respect to a variety of technologies, e.g., NMOS, PMOS, CMOS, etc., and it may be employed with a variety of different type devices, e.g., memory devices, microprocessors, logic devices, etc. The present invention may also be employed in the context of forming integrated circuit devices above silicon-on-insulator (SO) substrates and the like.

Figure 2A:
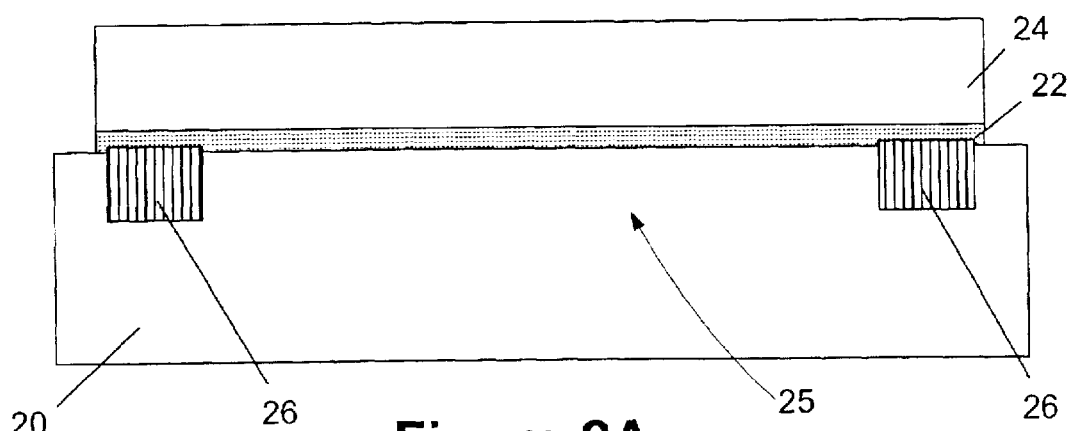
FIGS. 2A–2F are various cross-sectional views of a method in accordance with one illustrative embodiment of the present invention.

As shown in FIG. 2A, a gate insulation layer 22 and a layer of polysilicon 24 are formed above a substrate 20 having trench isolation regions 26 formed therein. As will be recognized by those skilled in the art, the area of the substrate 20 between the isolation regions 26 defines an active region 25 of the substrate 20 wherein semiconductor devices, e.g., transistors, will ultimately be formed. The gate insulation layer 22 may be comprised of a variety of materials, such as silicon dioxide, and it may be formed by a variety of techniques, e.g., thermal growth, deposition, etc. Moreover, the gate insulation layer 22 may have a thickness that ranges from approximately 1.5–3.0 nm. The layer of polysilicon 24 may be formed by a variety of techniques, e.g., chemical vapor deposition (CVD), plasma enhanced chemical vapor deposition (PECVD), etc. Moreover, the layer of polysilicon 24 may have a thickness ranging from approximately 110–150 nm. The isolation regions 26 may be formed by a variety of techniques. For example, a trench may be formed in the substrate 20 and thereafter filled with appropriate insulating material, such as silicon dioxide. The particular methodologies used to form the gate insulation layer 22, polysilicon layer 24 and isolation regions 26 should not be considered a limitation of the present invention unless such limitations are clearly set forth in the appended claims.

Figure 2B:
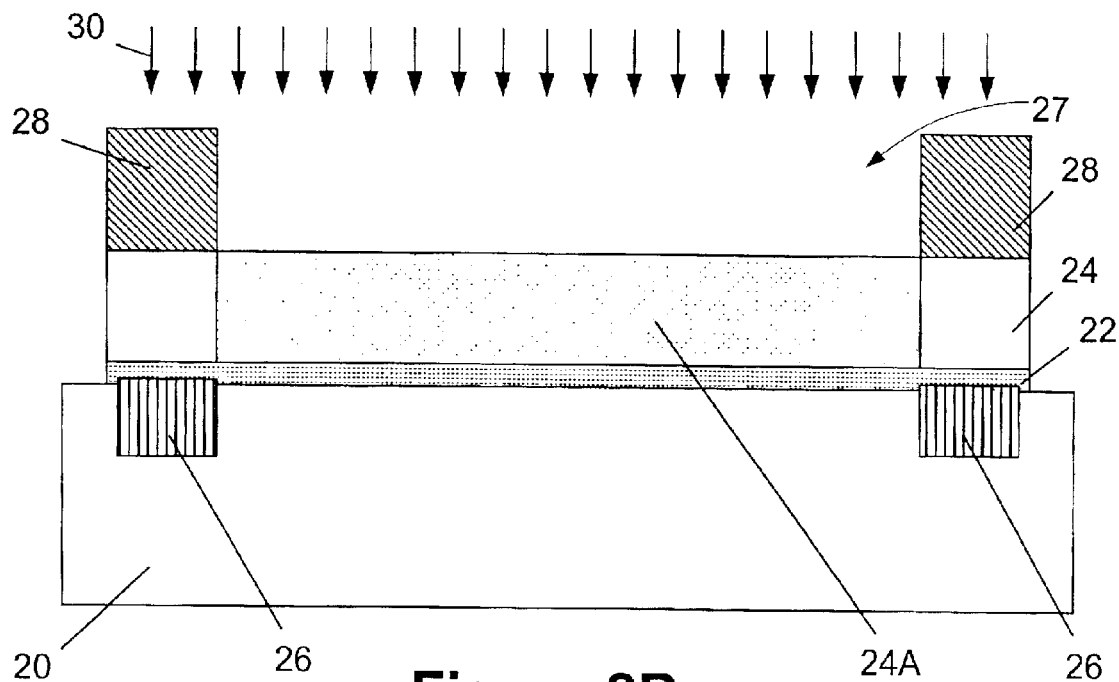

Next, as shown in FIG. 2B, a masking layer 28 is formed above the layer of polysilicon 24. The masking layer 28 may be comprised of a photoresist material (positive or negative) and it may be formed using a variety of known photolithography techniques. Then, an ion implant process, as indicated by arrows 30, is performed to implant dopant atoms into the layer of polysilicon 24 to form a doped region 24A in the area defined by openings 27 in the masking layer 28. The type of dopant material implanted during the implant process 30 will vary depending upon the type of transistor to be formed. For example, for an NMOS transistor, the ion implant process 30 will be performed using an N-type dopant material, e.g., arsenic, phosphorous. For a PMOS transistor, the ion implant process 30 will be performed using a P-type dopant material, e.g., boron, boron difluoride. The ion implant process 30 will be performed at a dopant dose of approximately $1e^{15}$–$8e^{15}$ ions/cm$^2$, to thereby result in a dopant concentration for the doped region 24A of approximately $1e^{18}$–$1e^{20}$ ions/cm$^3$. The energy level of the ion implant process 30 will vary depending upon the particular dopant species implanted during the process. For example, for N-type dopant materials, the implant energy may range from approximately 15–30 keV, and for P-type dopant materials, the implant energy may range from approximately 10–20 keV.

Figure 2C:
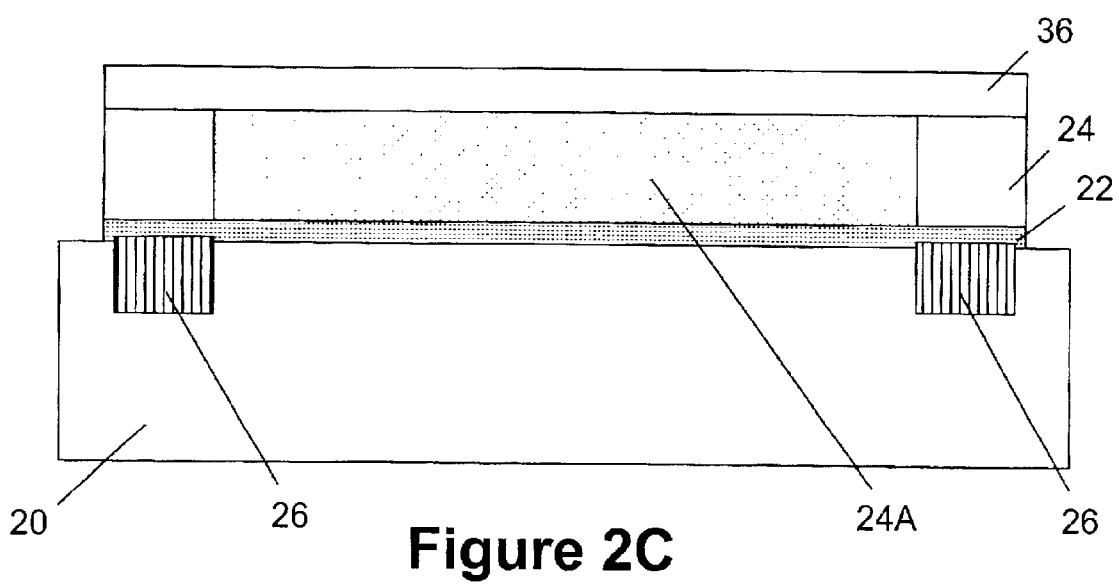

Next, as shown in FIG. 2C, the masking layer 28 is removed and an undoped layer of polysilicon 36 is formed above at least the doped region 24A of the polysilicon layer 24. The undoped layer of polysilicon 36 may be formed by a variety of techniques, e.g. CD, PECVD, and it may have a thickness of approximately 15–25 nm. Although the term "undoped" is used to describe the layer of polysilicon 36, those skilled in the art will recognize that the layer of polysilicon may have some small amount of dopant material present in the layer 36. In some cases, the layer of polysilicon 36 may have a relatively low concentration of dopant atoms present yet still be useful in the context of the present invention. As will be recognized by those skilled in the art after a complete reading of the present application, the present invention may be employed where there is a differential in the doping levels of the layer of polysilicon 36 and the doped regions 24A formed in the layer of polysilicon 24. This dopant concentration level differential may be as low as $1e^{16}$ ions/cm$^3$ while still maintaining at least some of the benefits of the present invention. In some cases, the doping level in the layer of polysilicon 36 may be 10–100 times less than the doping level in the doped region 24A of the layer of polysilicon 24.

Figure 2D:
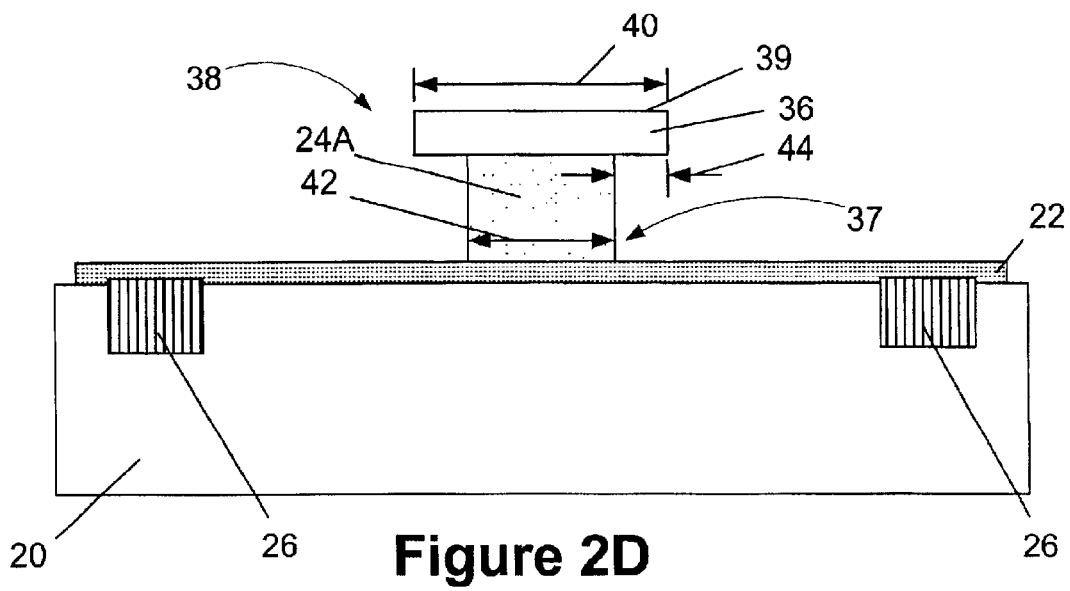

Next, one or more traditional etching processes, e.g., a plasma etching process, is performed on the structure depicted in FIG. 2C, which results in the gate electrode structure 38 depicted in FIG. 2D being formed. The gate electrode structure 38 in FIG. 2D has a generally T-shaped cross-sectional area that results from differences in the etch rate of the doped polysilicon region 24A versus the undoped or lightly-doped polysilicon layer 36. This etch rate differential may be on the order of approximately 3 Å per second. The etch rate differential is due to the different dopant concentration levels in the doped region 24A versus the layer of polysilicon 36. As stated previously, in some cases, the layer of polysilicon 36 may have essentially no dopant atoms present, or it may have a very low dopant concentration level.

The gate electrode structure 38 has a critical dimension 40 that may be readily formed using known photolithography and etching processes. For example, using current-day technology, the critical dimension 40 of the upper portion of the gate electrode structure 38 may be approximately 70–120 nm. The critical dimension 42 of the gate electrode structure 38 near its base 37 may be on the order of approximately 60–110 nm. The amount of undercut 44 of the gate electrode structure 38 will vary depending upon the relative dopant concentration levels in the doped region 24A and in the layer of polysilicon 36. Note that the gate electrode structure 38 has a width 40 at its upper surface 39 that is greater than a width 42 of the gate electrode structure 38 at the base 37.

Figure 2E:
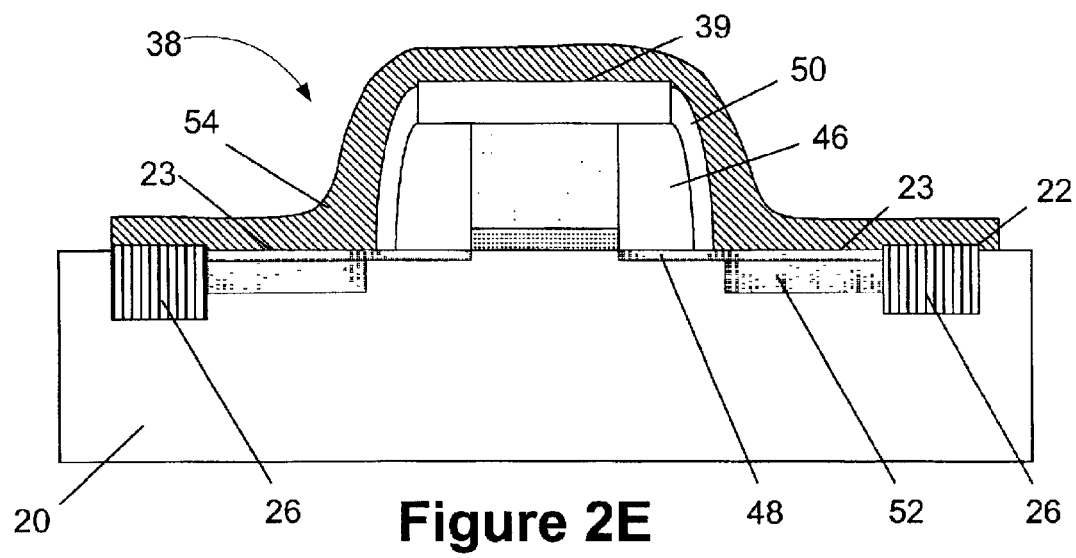
Figure 2F:
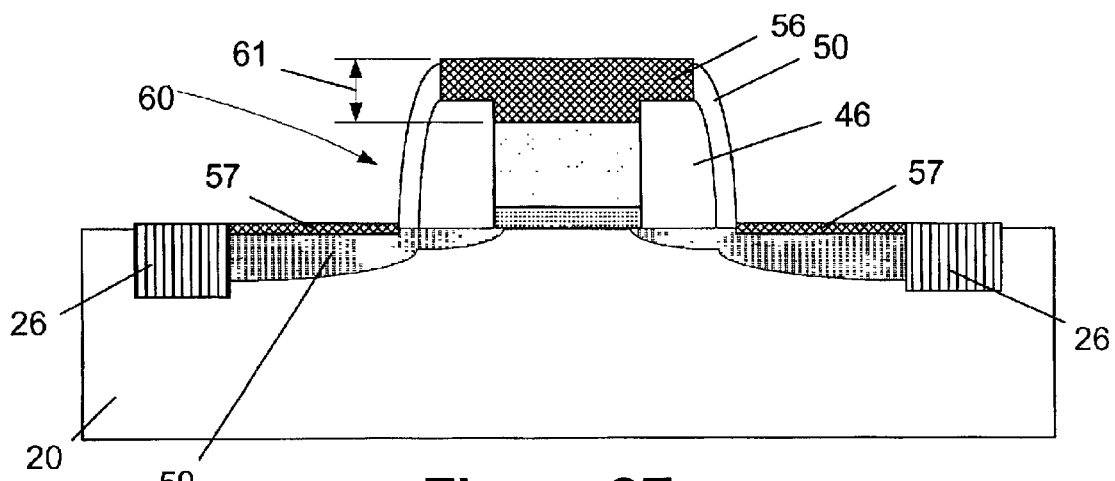

Next, as shown in FIG. 2E, various processing steps are performed to essentially complete the formation of a transistor 60. In one illustrative process flow, for an NMOS transistor, an initial extension implant process is performed to form extension implant regions 48 in the substrate 20. Thereafter, sidewall spacers 46 are formed adjacent the gate electrode structure 38 by depositing the appropriate material, e.g., silicon dioxide, silicon nitride, etc., and thereafter performing an anisotropic etching process. Next, a source/drain implant process is performed to form source/drain regions 52 in the bulk substrate. If desired, additional sidewall spacers 50 may be formed before or after the source/drain implant process is performed. If used, the sidewall spacers 50 may be comprised of a variety of materials, such as silicon nitride, silicon dioxide, etc. Of course, this process flow is provided by way of example only as it may be varied depending upon the type of device under construction. For example, with respect to a PMOS transistor, the sidewall spacers 46 may be formed prior to performing the extension implant process due to the increased mobility of P-type dopant atoms that would be implanted during such an extension implant process. As yet another alternative, the source/drain regions 52 may be formed after the sidewall spacers 46 are formed, i.e., the spacer 50 maybe omitted.

Next, a layer of refractory metal 54 is formed above the transistor 60. The refractory metal 54 may be comprised of a variety of materials, such as nickel, cobalt, titanium, platinum, tungsten, etc. The refractory metal layer 54 may be formed by a variety of techniques, e.g., physical vapor deposition "PVD", chemical vapor deposition "CVD", etc., and it may have a thickness that ranges from approximately 10–30 nm. The refractory metal layer 54 is in contact with an upper surface 39 of the undoped polysilicon portion 36 of the gate electrode 38, and with a surface 23 of the substrate 20 in the areas above the doped regions 48, 52.

Next, one or more anneal processes are performed to form a metal silicide region 56 on the gate electrode 38 and to form metal silicide regions 57 on the source/drain regions 59 of the transistor 60. Depending upon the thickness of the layer of refractory metal 54 and the undoped polysilicon portion 36, the metal silicide region 57 may extend into the doped region 24A. Of course, these metal silicide regions 56, 57 need not be formed of the same material nor is it required that they be formed at the same time, although that may be the case in one illustrative process flow. In one illustrative embodiment, the salicidation process is performed by performing a two-step heating process. In the first step, the transistor 60 is subjected to a temperature of approximately 450–500° C. Thereafter, unreacted portions of the refractory metal layer 54 are removed by an acid strip process. Then, a second higher-temperature heating process at, for example, a temperature of approximately 700–800° C. is performed to form the final metal silicide regions 56, 57. The metal silicide region 56 may have a thickness 61 that ranges from approximately 15–40 nm.

Figure 3A:
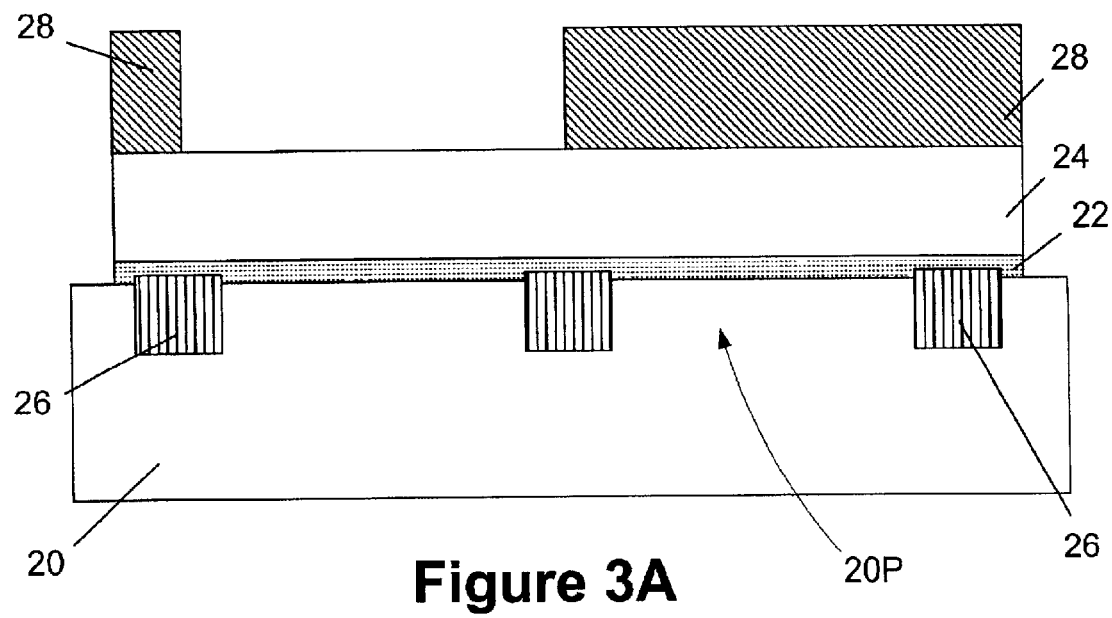
FIGS. 3A–3F depict another illustrative embodiment of a method in accordance with the present invention.
Figure 3B:
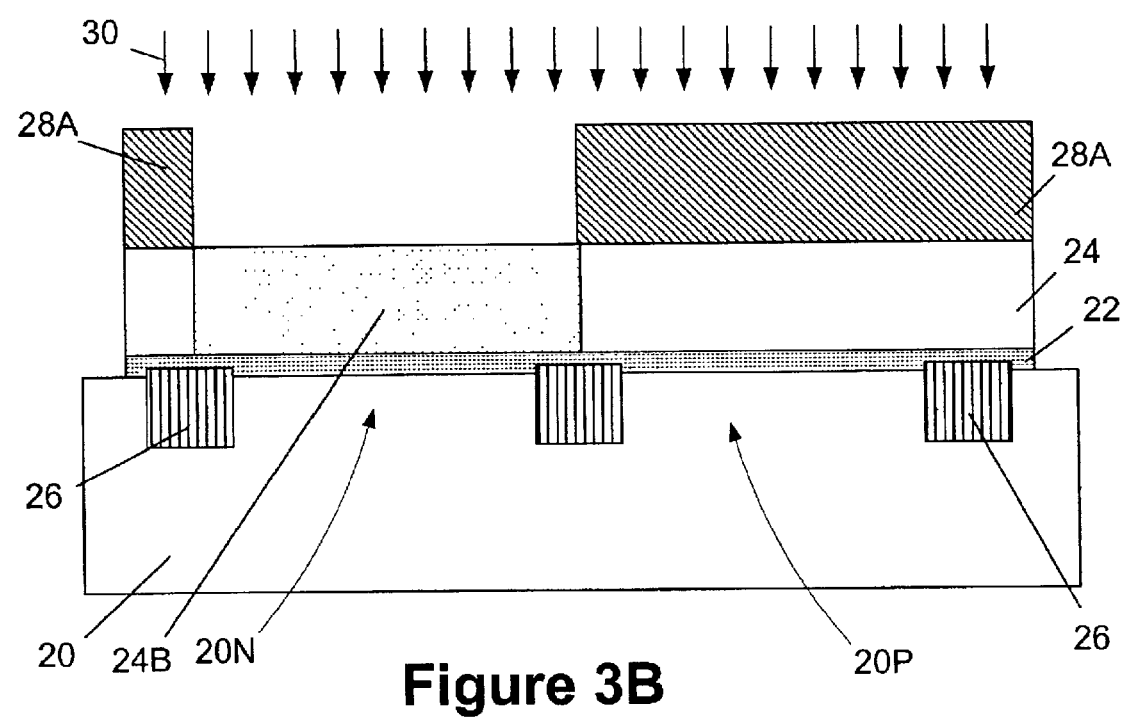

FIGS. 3A–3F depict an illustrative process flow wherein transistors of different types, e.g., PMOS and NMOS transistors, will be formed above a single substrate. For example, as shown in FIG. 3A, the gate insulation layer 22 and the polysilicon layer 24 are formed above the substrate 20 having a plurality of isolation regions 26 formed therein. Thereafter, a masking layer 28A comprised of, for example, a photoresist material, is formed above a portion 20P of the substrate 20 wherein PMOS-type transistors will be formed. Next, as shown in FIG. 3B, an implant process 30 comprised of the appropriate N-type dopant material is used to form the N-doped regions 24B in the polysilicon layer 24 above a portion 20N of the substrate 20 where NMOS transistors will be formed.

Figure 3C:
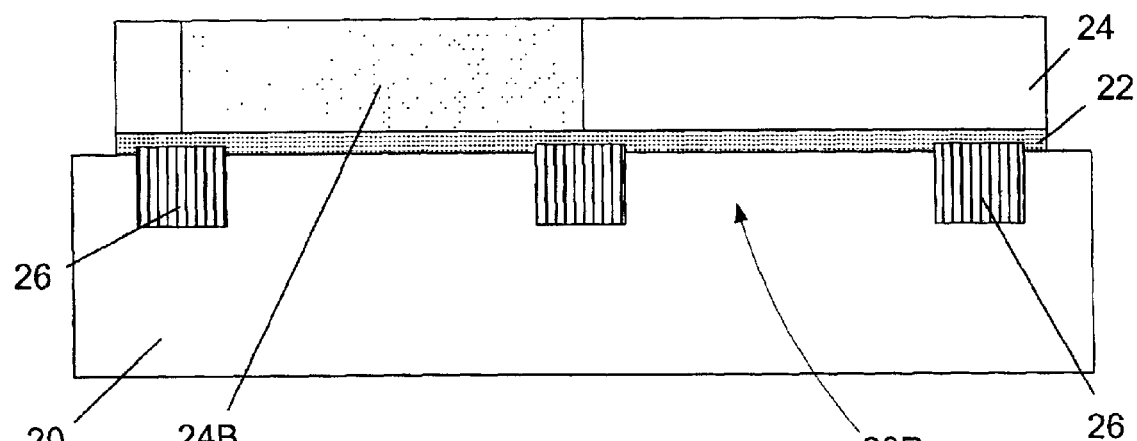
Figure 3D:
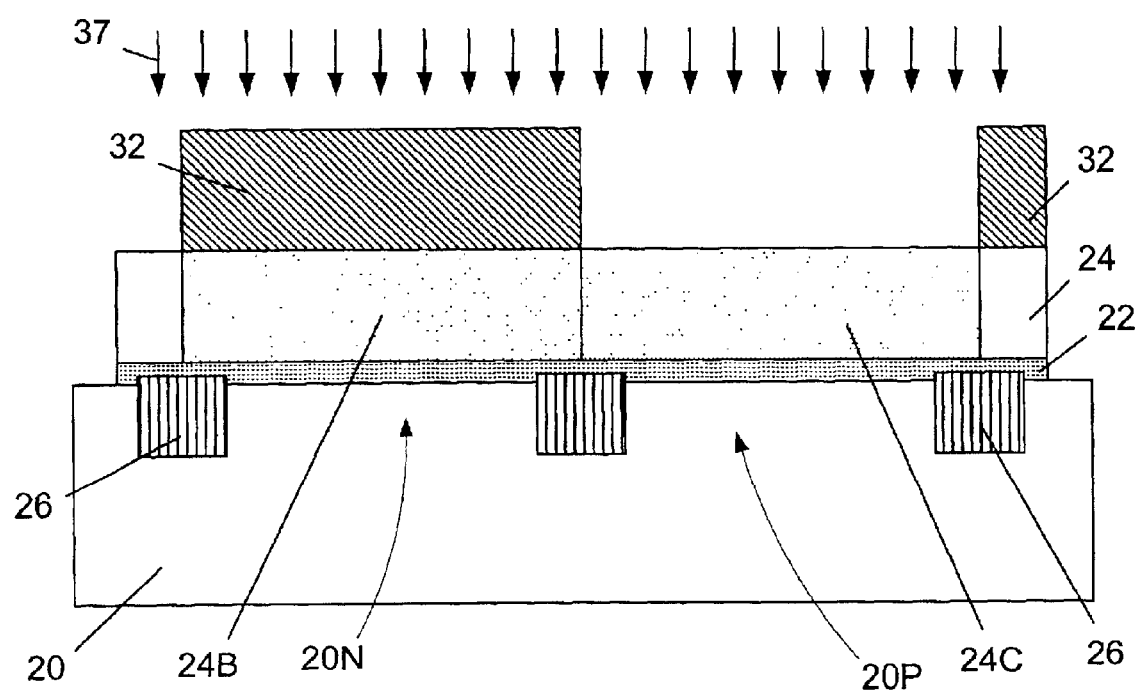
Figure 3E:
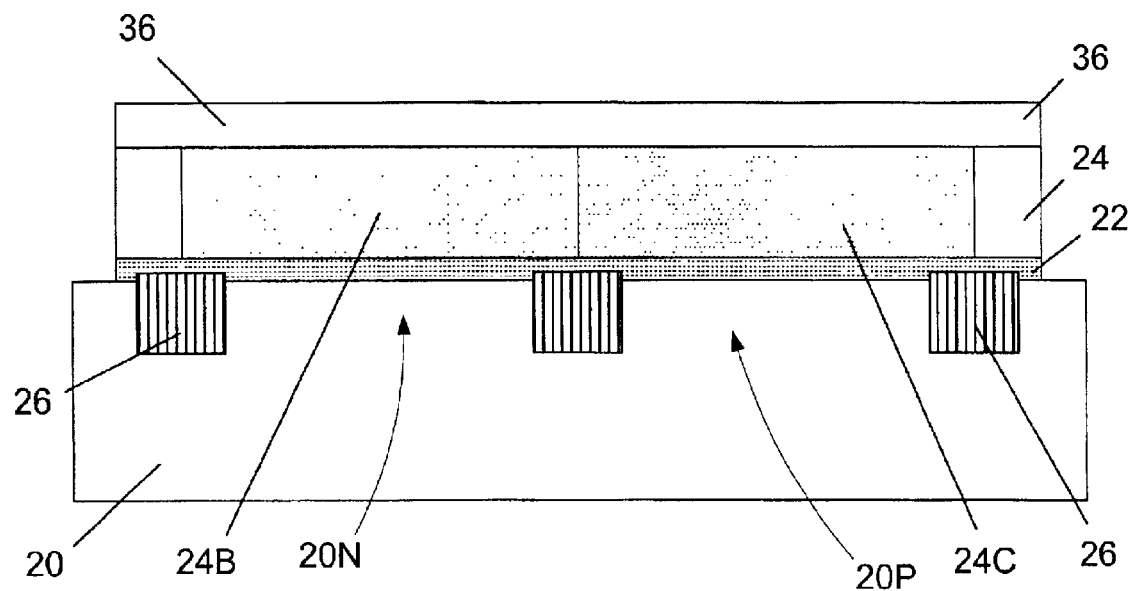

Thereafter, as indicated in FIG. 3C, the resist mask 28 is removed. As depicted in FIG. 3C, the layer of polysilicon 24 is now comprised of an N-doped region 24B. Then, as indicated in FIG. 3D, a resist mask 32 is formed above the N-doped region 24B and a P-type dopant material, such as boron, is implanted into the exposed region of the polysilicon layer 24 to form P-doped regions 24C, as indicated by the arrows 37. This results in the polysilicon layer 24 having an Undoped region 24B and a P-doped region 24C. Next, as indicated in FIG. 3E, the masking layer 32 is removed and an undoped layer of polysilicon 36 is formed above the polysilicon layer 24 (comprised of N-doped regions 24B and P-doped regions 24C).

Figure 3F:
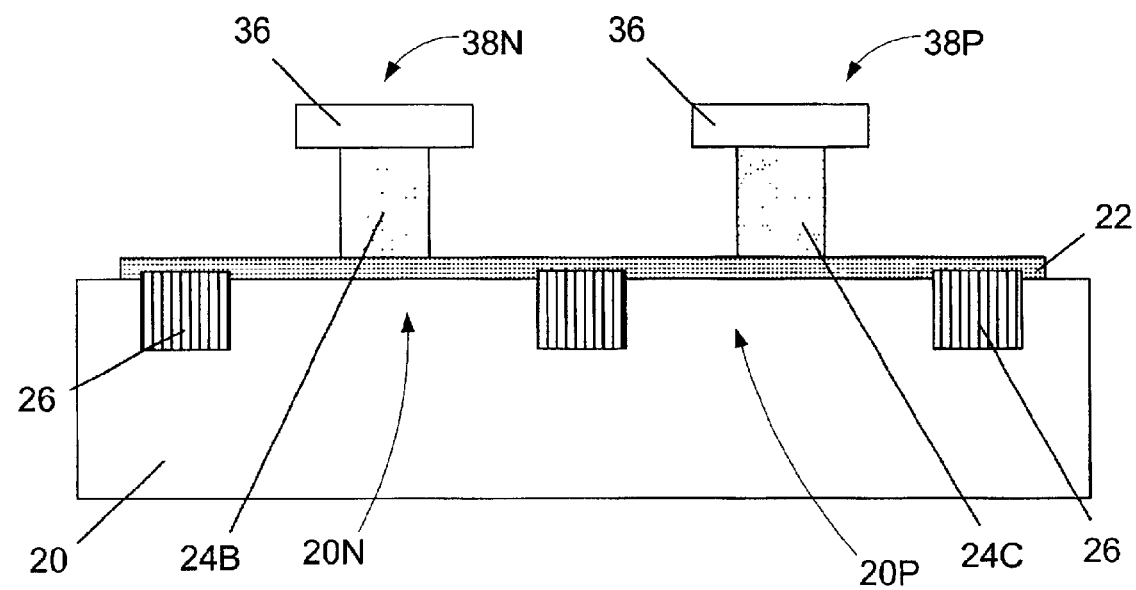

Then, one or more etching processes, i.e., anisotropic etching processes, may be performed to define the T-shaped gate electrode structures 38N, 38P as depicted in FIG. 3F. Thereafter, traditional processing may then be performed as described above to complete the formation of the appropriate type of transistors in the appropriate regions of the substrate. That is, NMOS transistors may be formed in regions of the substrate 20 wherein the N-doped regions 24B of the layer of polysilicon 24 are present, whereas PMOS transistors may be formed in the regions of the substrate 20 wherein P-doped regions 24C of the layer of polysilicon 24 are formed.

The present invention is generally directed to methods of making a shaped gate electrode structure, and a device comprising same. In one illustrative embodiment, the method comprises forming a gate insulation layer above a substrate, forming a layer of polysilicon above the gate insulation layer, implanting a dopant material into the layer of polysilicon, forming an undoped layer of polysilicon above the doped layer of polysilicon and performing an etching process on the undoped layer of polysilicon and the doped layer of polysilicon to define a gate electrode having a width at an upper surface that is greater than a width of the gate electrode at a base of the gate electrode. In further embodiments, the method comprises forming a layer of refractory metal above the gate electrode and performing at least one heating process to form a metal silicide region on the gate electrode structure.

In another illustrative embodiment, the method comprises forming a gate insulation layer above a substrate, forming a first layer of polysilicon above the gate insulation layer, implanting a dopant material into the first layer of polysilicon to form a doped region having a dopant concentration level in the layer of polysilicon, forming a second layer of polysilicon above the doped region of the first layer of polysilicon, the second layer of polysilicon having a dopant concentration level that is less than the dopant concentration level of the doped region in the first layer of polysilicon, and performing an etching process on the second layer of polysilicon and the doped region in the first layer of polysilicon to define a gate electrode having a width at an upper surface that is greater than a width of the gate electrode at a base of the gate electrode.

Through use of the present invention, device performance and manufacturing yields may be improved. More particularly, the present invention provides a means by which effective metal silicide regions may be formed on transistors as the critical dimension of gate electrode structures continues to decrease. That is, even as gate critical dimensions continue to decrease, the present invention may be employed to form metal silicide regions on transistors having such gate electrodes. Moreover, this is accomplished in the present invention using standard polysilicon etch, mask and salicidation processes. The present invention also provides a mechanism for reducing the critical dimension of features formed on an integrated circuit device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. According, the protection sought herein is as set forth in the claims below.

What is claimed:

1. A method, comprising:
   forming a gate insulation layer above a substrate;
   forming a first layer of polysilicon above said gate insulation layer;
   implanting a dopant material into said first layer of polysilicon to define a doped region therein;
   forming a second doped layer of polysilicon above said doped region of said first layer of polysilicon said second doped layer of polysilicon having a dopant concentration that is 10–100 times less than a dopant concentration of said doped region; and
   performing an etching process on said second doped layer of polysilicon and said doped region of said first layer of polysilicon to define a gate electrode having a width at an upper surface that is greater than a width of said gate electrode at a base of said gate electrode.

2. The method of claim 1, wherein forming a gate insulation layer above a substrate comprises forming a gate insulation layer comprised of silicon dioxide above a substrate.

3. The method of claim 1, wherein said dopant concentration of said second doped layer of polysilicon is less than said dopant concentration of said doped region in said first layer of polysilicon by approximately $1e^{16}$ ions/cm$^3$.

4. The method of claim 1, wherein said first layer of polysilicon is thick than said second doped layer of polysilicon.

5. The method of claim 1, wherein said method is used to form a gate electrode structure for an NMOS transistor and wherein implanting a dopant material into said first layer of polysilicon comprises implanting an N-type dopant material into said first layer of polysilicon.

6. The method of claim 1, wherein implanting a dopant material into said first layer of polysilicon comprises implanting ions at a dopant dose that ranges from approximately $1e^{15}$–$8e^{15}$ ions/cm$^2$.

7. The method of claim 1, wherein implanting a dopant material into said first layer of polysilicon to define a doped region therein comprises implanting a dopant material comprised of at least one of arsenic and phosphorous into said first layer of polysilicon to define an N-doped region therein.

8. The method of claim 1, wherein performing an etching process comprises performing a plasma etching process.

9. The method of claim 1, wherein forming a second doped layer of polysilicon above said doped region of said first layer of polysilicon comprises depositing a second doped layer of polysilicon above said doped region of said first layer of polysilicon.

10. The method of claim 1, wherein forming a first layer of polysilicon above said gate insulation layer comprises forming a first layer of polysilicon having a thickness ranging from approximately 110–150 nm above said gate insulation layer.

11. The method of claim 10, wherein forming a second doped layer of polysilicon above said doped region of said first layer of polysilicon comprises forming a second doped layer of polysilicon having a thickness of approximately 15–25 nm above said doped region of said first layer of polysilicon.

12. The method of claim 1, further comprising forming a layer of refractory metal above said gate electrode and performing at least one heating process to form a metal silicide region on said gate electrode structure.

13. The method of claim 12, wherein said layer of refractory metal is comprised of at least one of cobalt, titanium, nickel and platinum.

14. The method of claim 12, wherein performing at least one heating process comprises performing a first heating process at a temperature ranging from approximately 450–500° C. and performing a second heating process at a temperature ranging from approximately 700–800° C.

15. A method, comprising:
   formiing a gate insulation layer above a substrate;
   depositing a first layer of polysilicon above said gate insulation layer, said first layer of polysilicon having a thickness of approximately 110–150 nm;
   implanting a dopant material into said first layer of polysilicon to form a doped region having a dopant concentration level in said first layer of polysilicon;

forming a second doped layer of polysilicon above said doped region of said first layer of polysilicon, said second doped layer of polysilicon having a dopant concentration level that is 10–100 times less than said dopant concentration level of said doped region in said first layer of polysilicon, said second doped layer of polysilicon having a thickness of approximately 15–25 nm; and performing an etching process on said second doped layer of polysilicon and said doped region in said first layer of polysilicon to define a gate electrode having a width at an upper surface that is greater than a width of said gate electrode at a base of said gate electrode.

16. The method of claim 15, wherein forming a gate insulation layer above a substrate comprises forming a gate insulation layer comprised of silicon dioxide above a substrate.

17. The method of claim 15, wherein forming a gate insulation layer above a substrate comprises forming a gate insulation layer above a substrate by performing at least one of a thermal oxidation process and a deposition process.

18. The method of claim 15, wherein said dopant concentration of said second doped layer of polysilicon is less than said dopant concentration of said doped region by approximately $1e^{16}$ ions/cm$^3$.

19. The method of claim 15, wherein said method is used to form a gate electrode structure for an NMOS transistor and wherein implanting a dopant material into said first layer of polysilicon comprises implanting an N-type dopant material into said first layer of polysilicon.

20. The method of claim 15, wherein implanting a dopant material into said first layer of polysilicon comprises implanting ions at a dopant dose that ranges from approximately $1e^{15}$–$8e^{15}$ ions/cm$^2$.

21. The method of claim 15, wherein implanting a dopant material into said first layer of polysilicon comprises implanting a dopant material comprised of at least one of arsenic and phosphorous into said first layer of polysilicon.

22. The method of claim 15, wherein performing an etching process comprises performing a plasma etching process.

23. The method of claim 15, wherein forming a second doped layer of polysilicon comprises depositing a second doped layer of polysilicon.

24. The method of claim 15, wherein said width of said gate eletrode at said upper surface is approximately 70–120 nm, and said width of said gate electrode at said base of said gate electrode is approximately 60–110 nm.

25. The method of claim 15, further comprising forming a layer of refractory metal above said gate electrode and performing at least one heating process to form a metal silicide region on said gate electrode.

26. The method of claim 25, wherein said layer of refractory metal is comprised of at least one of cobalt, titanium, nickel and platinum.

27. The method of claim 25, wherein performing at least one heating process comprises performing a first heating process at a temperature ranging from approximately 450–500° C. and performing a second heating process at a temperature ranging from approximately 700–800° C.

28. A method, comprising:

forming a gate insulation layer comprised of silicon dioxide above a substrate;

depositing a first layer of polysilicon above said gate insulation layer, said first layer of polysilicon having a thickness of approximately 110–150 nm;

implanting a dopant material into said first layer of polysilicon to form a doped region having a dopant concentration level in said layer of polysilicon;

forming a second doped layer of polysilicon above said doped region of said first layer of polysilicon, said second doped layer of polysilicon having a dopant concentration level that is 10–100 times less than said dopant concentration level of said doped region in said first layer of polysilicon, said second doped layer of polysilicon having a thickness of approximately 15–25 nm; and performing an etching process on said second doped layer of polysilicon and said doped region in said first layer of polysilicon to define a gate electrode having a width at an upper surface that is greater than a width of said gate electrode at a base of said gate electrode, wherein said width of said gate electrode at said upper surface is approximately 70–120 nm and said width of said gate electrode at said base is approximately 15–25 nm.

29. The method of claim 28, wherein said dopant concentration of said second doped layer of polysilicon is less than said dopant concentration of said doped region by approximately $1e^{16}$ ions/cm$^3$.

30. The method of claim 28, wherein forming a gate insulation layer comprised of silicon dioxide above a substrate comprises forming a gate insulation layer comprised of silicon dioxide above a substrate by performing at least one of a thermal oxidation process and a deposition process.

31. The method of claim 28, wherein said method is used to form a gate electrode structure for an NMOS transistor and wherein implanting a dopant material into said first layer of polysilicon comprises implanting an N-type dopant material into said first layer of polysilicon.

32. The method of claim 28, wherein implanting a dopant material into said first layer of polysilicon comprises implanting ions at a dopant dose that ranges from approximately $1e^{15}$–$8e^{15}$ ions/cm$^2$.

33. The method of claim 28, wherein implanting a dopant material into said first layer of polysilicon comprises implanting a dopant material comprised of at least one of arsenic and phosphorous into said first layer of polysilicon.

34. The method of claim 28, wherein performing an etching process comprises performing a plasma etching process.

35. The method of claim 31, wherein performing at least one heating process comprises performing a first heating process at a temperature ranging from approximately 450–500° C. and performing a second heating process at a temperature ranging from approximately 700–800° C.

36. The method of claim 28, wherein forming a second layer of polysilicon comprises depositing a second layer of polysilicon.

37. The method of claim 28, further comprising forming a layer of refractory metal above said gate electrode and performing at least one heating process to form a metal silicide region on said gate electrode.

38. The method of claim 37, wherein said layer of refractory metal is comprised of at least one of cobalt, titanium, nickel and platinum.

39. A method, comprising:

forming a gate insulation layer comprised of silicon dioxide above a substrate;

depositing a first layer of polysilicon above said gate insulation layer;

implanting an N-type dopant material into said first layer of polysilicon to form an N-doped region having a dopant concentration level in said layer of polysilicon;

depositing a second doped layer of polysilicon above said N-doped region of said first layer of polysilicon, said second doped layer of polysilicon having a dopant concentration level that is 10–100 times less than said dopant concentration level of said N-doped region in said first layer of polysilicon; and performing an etching process on said second doped layer of polysilicon and said N-doped region in said first layer of polysilicon to define a gate electrode having a width at an upper surface that is greater than a width of said gate electrode at a base of said gate electrode.

40. The method of claim 39, wherein said first layer of polysilicon is thicker than said second doped layer of polysilicon.

41. The method of claim 39, wherein forming a gate insulation layer comprised of silicon dioxide above a substrate comprises forming a gate insulation layer comprised of silicon dioxide above a substrate by performing at least one of a thermal oxidation process and a deposition process.

42. The method of claim 39, wherein implanting an N-type dopant material into said first layer of polysilicon comprises implanting ions at a dopant dose that ranges from approximately $1e^{15}-8e^{15}$ ions/cm$^2$.

43. The method of claim 39, wherein implanting an N-type dopant material into said first layer of polysilicon comprises implanting a dopant material comprised of at least one of arsenic and phosphorous into said first layer of polysilicon.

44. The method of claim 39, wherein performing an etching process comprises performing a plasma etching process.

45. The method of claim 39, wherein depositing a first layer of polysilicon above said gate insulation layer comprises depositing a first layer of polysilicon having a thickness ranging from approximately 110–150 nm above said gate insulation layer.

46. The method of claim 45, wherein depositing a second doped layer of polysilicon comprises depositing a second layer of polysilicon to a thickness that ranges from approximately 15–25 nm.

47. The method of claim 39, further comprising forming a layer of refractory metal above said gate electrode and performing at least one heating process to form a metal silicide region on said gate electrode.

48. The method of claim 47, wherein said layer of refractory metal is comprised of at least one of cobalt, titanium, nickel and platinum.

49. The method of claim 47, wherein performing at least one heating process comprises performing a first heating process at a temperature ranging from approximately 450–500° C. and performing a second heating process at a temperature ranging from approximately 700–800° C.

50. A method, comprising:

forming a gate insulation layer above a substrate;

forming a first layer of polysilicon above said gate insulation layer;

implanting a dopant material into said first layer of polysilicon to define a doped region therein;

forming a second doped layer of polysilicon above said doped region of said first layer of polysilicon, wherein a thickness of said second doped layer of polysilicon is less than a thickness of said first layer of polysilicon; and performing an etching process on said second doped layer of polysilicon and said doped region of said first layer of polysilicon to define a gate electrode having a width at an upper surface that is greater than a width of said gate electrode at a base of said gate electrode.

51. The method of claim 50, wherein forming a gate insulation layer above a substrate comprises forming a gate insulation layer comprised of silicon dioxide above a substrate.

52. The method of claim 50, further comprising forming a layer of refractory metal above said gate electrode and performing at least one heating process to form a metal silicide region on said gate electrode structure.

53. The method of claim 50, wherein forming said first layer of polysilicon above said gate insulation layer comprises forming said first layer of polysilicon to a thickness ranging from approximately 110–150 nm above said gate insulation layer.

54. The method of claim 53, wherein forming said second doped layer of polysilicon above said doped region of said first layer of polysilicon comprises forming said second doped layer of polysilicon to a thickness of approximately 15–25 nm above said doped region of said first layer of polysilicon.

* * * * *

UNITED STATES PATENT AND TRADEMARK OFFICE
CERTIFICATE OF CORRECTION

PATENT NO.    : 6,767,835 B1
DATED         : July 27, 2004
INVENTOR(S)   : Homi E. Nariman and David E. Brown It is certified that error appears in the above-identified patent and that said Letters Patent is hereby corrected as shown below:

Column 7,
Line 64, after "said first layer of polysilicon" insert a comma.

Column 8,
Line 15, change "thick" to -- thicker --.
Line 61, change "formiing" to -- forming --.

Column 9,
Line 44, change "eletrode" to -- electrode --.

Signed and Sealed this

Thirtieth Day of November, 2004

JON W. DUDAS
*Director of the United States Patent and Trademark Office*